(12) United States Patent
Lian

(10) Patent No.: US 12,256,623 B2
(45) Date of Patent: Mar. 18, 2025

(54) OLED DISPLAY PANEL AND ELECTRONIC DEVICE WITH IMPROVED ENCAPSULATION EFFECT

(71) Applicant: SHENZHEN CHINA STAR OPTOELECTRONICS SEMICONDUCTOR DISPLAY TECHNOLOGY CO., LTD., Shenzhen (CN)

(72) Inventor: Wendong Lian, Shenzhen (CN)

( * ) Notice: Subject to any disclaimer, the term of this patent is extended or adjusted under 35 U.S.C. 154(b) by 0 days.

(21) Appl. No.: 17/620,698

(22) PCT Filed: Dec. 16, 2021

(86) PCT No.: PCT/CN2021/138873
§ 371 (c)(1),
(2) Date: Dec. 19, 2021

(87) PCT Pub. No.: WO2023/097796
PCT Pub. Date: Jun. 8, 2023

(65) Prior Publication Data
US 2024/0049567 A1    Feb. 8, 2024

(30) Foreign Application Priority Data

Dec. 3, 2021    (CN) .......................... 202111465094.6

(51) Int. Cl.
*H10K 59/80*    (2023.01)
(52) U.S. Cl.
CPC ................................ *H10K 59/873* (2023.02)

(58) Field of Classification Search
None
See application file for complete search history.

(56) References Cited

U.S. PATENT DOCUMENTS

2014/0138634 A1\*    5/2014    Lee .................. H10K 59/126
257/40
2016/0204373 A1    7/2016    Park
(Continued)

FOREIGN PATENT DOCUMENTS

| CN | 103985817 A | 8/2014 |
| CN | 104347670 A | 2/2015 |

(Continued)

OTHER PUBLICATIONS

Japanese Office Action issued in corresponding Japanese Patent Application No. 特願2021-576692 dated Feb. 19, 2024, pp. 1-5.

(Continued)

*Primary Examiner* — Daniel Whalen

(57) ABSTRACT

The present application discloses an OLED display panel and an electronic device. The OLED display panel includes a display main body and an encapsulation structure, wherein the display main body has a display area and a non-display area defined at a periphery of the display area; and an encapsulation structure disposed at one side of the display main body, wherein the encapsulation structure extends from the display area to the non-display area, the encapsulation structure includes a first organic layer, a first inorganic layer, and a second organic layer that are sequentially stacked, and the second organic layer covers a side surface of the first organic layer.

15 Claims, 3 Drawing Sheets

(56) References Cited

U.S. PATENT DOCUMENTS

| | | | |
|---|---|---|---|
| 2017/0110532 A1* | 4/2017 | Kim | H10K 50/8445 |
| 2018/0366520 A1 | 12/2018 | Gwon et al. | |
| 2019/0179466 A1 | 6/2019 | Kim et al. | |
| 2019/0189731 A1 | 6/2019 | Managaki | |
| 2019/0229289 A1 | 7/2019 | Kim et al. | |

FOREIGN PATENT DOCUMENTS

| | | |
|---|---|---|
| CN | 106328671 A | 1/2017 |
| CN | 107437553 A | 12/2017 |
| CN | 108847451 A | 11/2018 |
| CN | 109671867 A | 4/2019 |
| CN | 209328948 U | 8/2019 |
| CN | 110663120 A | 1/2020 |
| CN | 111129346 A | 5/2020 |
| CN | 212625586 U | 2/2021 |
| CN | 113285043 A | 8/2021 |
| CN | 213958990 U | 8/2021 |
| JP | 2018037390 A | 3/2018 |
| JP | 2020060651 A | 4/2020 |
| JP | 2020113421 A | 7/2020 |
| JP | 2021003126 A | 1/2021 |
| JP | 2021056197 A | 4/2021 |
| WO | 2020145022 A1 | 7/2020 |
| WO | 2020213451 A1 | 10/2020 |

OTHER PUBLICATIONS

International Search Report in International application No. PCT/CN2021/138873, mailed on Apr. 28, 2022.
Written Opinion of the International Search Authority in International application No. PCT/CN2021/138873, mailed on Apr. 28, 2022.
Chinese Office Action issued in corresponding Chinese Patent Application No. 202111465094.6 dated Nov. 8, 2022, pp. 1-8.
Eurasian Office Action issued in corresponding Eurasian Patent Application No. 202291624 dated Nov. 20, 2024, pp. 1-2.

* cited by examiner

OLED DISPLAY PANEL AND ELECTRONIC DEVICE WITH IMPROVED ENCAPSULATION EFFECT

BACKGROUND OF INVENTION

Field of Invention

The present application relates to a field of display technology, in particular to an organic light-emitting diode (OLED) display panel and electronic device.

Description of Prior Art

Organic light-emitting diode (OLED) displays are current-type organic light-emitting devices, and widely used in flexible display industry due to their simple structure, self-luminous, fast response times, ultra-thin thicknesses, and low power consumption. Since intrusion of external water vapor will increase a risk of failure of the OLED devices, after processes of manufacturing panels in the OLED devices, encapsulation is usually required to reduce the risk of failure of the OLED devices.

At present, a mainstream of a flexible encapsulation method is to adopt thin film encapsulation (TFE), that is, a laminated structure of an inorganic film and an organic film, wherein the inorganic film covers the organic film. The inorganic film is configured to serve as a main water vapor barrier layer, and the inorganic film is usually prepared by chemical vapor deposition (CVD). The organic film is configured to prolong an intrusion path of the water vapor and release a stress of the inorganic film. The organic film is usually formed by ink-printing with an inkjet printing equipment, followed by leveling and curing. Under normal circumstances, there are two ways for external water vapor to intrude into a panel, one is intruding through a front of the panel, and another is intruding through a side of the panel. With narrowing of a product bezel, a distance between a boundary of the organic film and a boundary of the inorganic film boundary is getting closer and closer. When the inorganic layer at the edge of the panel has a decreased water resistance or cracks, external water vapor will directly enter the display area along the organic film, causing encapsulation for the edge of the panel to fail.

SUMMARY OF INVENTION

Embodiments of the present application provide an OLED display panel and an electronic device to improve an encapsulation effect at an edge of the OLED display panel.

An embodiment of the present application provides an OLED display panel, which includes:
a display main body, wherein the display main body has a display area and a non-display area defined at a periphery of the display area; and
an encapsulation structure disposed at one side of the display main body, wherein the encapsulation structure extends from the display area to the non-display area, the encapsulation structure includes a first organic layer, a first inorganic layer, and a second organic layer that are sequentially stacked, and the second organic layer covers a side surface of the first organic layer.

Optionally, in some embodiments of the present application, the encapsulation structure further includes a second inorganic layer and a third inorganic layer, the second inorganic layer is disposed at a side of the first organic layer close to the display main body, and the third inorganic layer is located on a side of the second organic layer away from the first inorganic layer.

Optionally, in some embodiments of the present application, the display main body includes a driving substrate, a light-emitting layer, and a first electrode, the light-emitting layer is disposed on the driving substrate and located in the display area, and the first electrode covers a side of the light-emitting layer away from the driving substrate and extends from the display area to the non-display area; and
wherein an orthographic projection of the first organic layer on a plane where the driving substrate is located is within an orthographic projection of the first electrode on the plane where the driving substrate is located.

Optionally, in some embodiments of the present application, the OLED display panel further includes a dam, wherein the dam surrounds a periphery of the first organic layer and is located on a side of the first electrode away from the driving substrate.

Optionally, in some embodiments of the present application, the second organic layer covers a side surface of the first electrode; and
the OLED display panel further includes a retaining wall, the retaining wall is disposed on the driving substrate and located at a side of the second organic layer away from the display area, and each of the first inorganic layer, the second inorganic layer, and the third inorganic layer covers the retaining wall.

Optionally, in some embodiments of the present application, the second organic layer covers a side surface of the first electrode; and
the OLED display panel further includes a retaining wall disposed on the driving substrate and located at a side of the second organic layer away from the display area, the second inorganic layer is located at a side of the dam close to the display area, the first organic layer covers a side surface of the second inorganic layer, and each of the first inorganic layer and the third inorganic layer covers the retaining wall.

Optionally, in some embodiments of the present application, the second organic layer covers a side surface of the first electrode; and
the OLED display panel further includes a retaining wall disposed on the driving substrate and located at a side of the second organic layer away from the display area, the second inorganic layer is located at a side of the dam close to the display area, the first organic layer covers a side surface of the second inorganic layer, the first inorganic layer is located at a side of the retaining wall close to the display area, the second organic layer covers a side surface of the first inorganic layer, and the third inorganic layer covers the retaining wall.

Optionally, in some embodiments of the present application, the display area includes an effective display area and an ineffective display area, the ineffective display area is defined between the effective display area and the non-display area, and the first organic layer extends from the effective display area to the non-display area.

Optionally, in some embodiments of the present application, the display main body includes a driving substrate, a light-emitting layer, and a first electrode, the light-emitting layer is disposed on the driving substrate and located in the display area, and the first electrode covers a side of the light-emitting layer away from the driving substrate and extends from the display area to the non-display area; and wherein the first organic layer covers a side surface of the first electrode.

Optionally, in some embodiments of the present application, the OLED display panel further includes a retaining wall located at a side of the second organic layer away from the display area, and each of the first inorganic layer, the second inorganic layer, and the third inorganic layer covers the retaining wall.

Optionally, in some embodiments of the present application, the OLED display panel further includes a dam, the dam is disposed between the retaining wall and the second organic layer, and a height of the dam is smaller than a height of the retaining wall.

Optionally, in some embodiments of the present application, the OLED display panel further includes a dam, the dam is disposed between the retaining wall and the first organic layer, and a height of the dam is smaller than a height of the retaining wall, and the second organic layer covers the dam and extends to an area between the dam and the retaining wall.

Another embodiment of the present application also provides an OLED display panel, which includes:
- a display main body, wherein the display main body has a display area and a non-display area defined at a periphery of the display area, the display area includes an effective display area and an ineffective display area, and the ineffective display area is defined between the effective display area and the non-display area; and
- an encapsulation structure disposed at one side of the display main body, wherein the encapsulation structure extends from the display area to the non-display area, the encapsulation structure includes a first organic layer, a first inorganic layer, and a second organic layer that are sequentially stacked, the first organic layer extends from the effective display area to the non-display area, and the second organic layer covers a side surface of the first organic layer,
- wherein the encapsulation structure further includes a second inorganic layer and a third inorganic layer, the second inorganic layer is disposed at a side of the first organic layer close to the display main body, and the third inorganic layer is located on a side of the second organic layer away from the first inorganic layer.

An embodiment of the present application further provides an electronic device, the electronic device includes a housing and an organic light-emitting diode (OLED) display panel disposed in the housing, and the OLED display panel includes:
- a display main body, wherein the display main body has a display area and a non-display area defined at a periphery of the display area; and
- an encapsulation structure disposed at one side of the display main body, wherein the encapsulation structure extends from the display area to the non-display area, the encapsulation structure includes a first organic layer, a first inorganic layer, and a second organic layer that are sequentially stacked, and the second organic layer covers a side surface of the first organic layer.

Optionally, in some embodiments of the present application, the encapsulation structure further includes a second inorganic layer and a third inorganic layer, the second inorganic layer is disposed at a side of the first organic layer close to the display main body, and the third inorganic layer is located on a side of the second organic layer away from the first inorganic layer Optionally, in some embodiments of the present application, the display main body includes a driving substrate, a light-emitting layer, and a first electrode, the light-emitting layer is disposed on the driving substrate and located in the display area, and the first electrode covers a side of the light-emitting layer away from the driving substrate and extends from the display area to the non-display area; and
- wherein an orthographic projection of the first organic layer on a plane where the driving substrate is located is within an orthographic projection of the first electrode on the plane where the driving substrate is located.

Optionally, in some embodiments of the present application, the OLED display panel further includes a dam, wherein the dam surrounds a periphery of the first organic layer and is located on a side of the first electrode away from the driving substrate.

Optionally, in some embodiments of the present application, the second organic layer covers a side surface of the first electrode; and
the OLED display panel further includes a retaining wall, the retaining wall is disposed on the driving substrate and located at a side of the second organic layer away from the display area, and each of the first inorganic layer, the second inorganic layer, and the third inorganic layer covers the retaining wall.

Optionally, in some embodiments of the present application, the second organic layer covers a side surface of the first electrode; and
the OLED display panel further includes a retaining wall disposed on the driving substrate and located at a side of the second organic layer away from the display area, the second inorganic layer is located at a side of the dam close to the display area, the first organic layer covers a side surface of the second inorganic layer, and each of the first inorganic layer and the third inorganic layer covers the retaining wall.

Optionally, in some embodiments of the present application, the second organic layer covers a side surface of the first electrode; and
the OLED display panel further includes a retaining wall disposed on the driving substrate and located at a side of the second organic layer away from the display area, the second inorganic layer is located at a side of the dam close to the display area, the first organic layer covers a side surface of the second inorganic layer, the first inorganic layer is located at a side of the retaining wall close to the display area, the second organic layer covers a side surface of the first inorganic layer, and the third inorganic layer covers the retaining wall.

Compared with an OLED display panel in the prior art, the OLED display panel provided by the present application provides the first organic layer and the second organic layer in the encapsulation structure, and the second organic layer covers the side surface of the first organic layer. When external water vapor intrudes into the encapsulation structure from an edge of the panel, if the inorganic layer at the edge of the panel has a decreased water resistance or cracks, the external water vapor will first enter the second organic layer and then the first organic layer, so that the arrangement of the two organic layers is configured to prolong an intrusion path of the water vapor and delay a time of water vapor intrusion into the display area, thereby improving an encapsulation effect at the edge of the OLED display panel.

BRIEF DESCRIPTION OF DRAWINGS

In order to more clearly illustrate the technical solutions of the embodiments of the present application, the drawings illustrating the embodiments will be briefly described below.

Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

Figure 1:
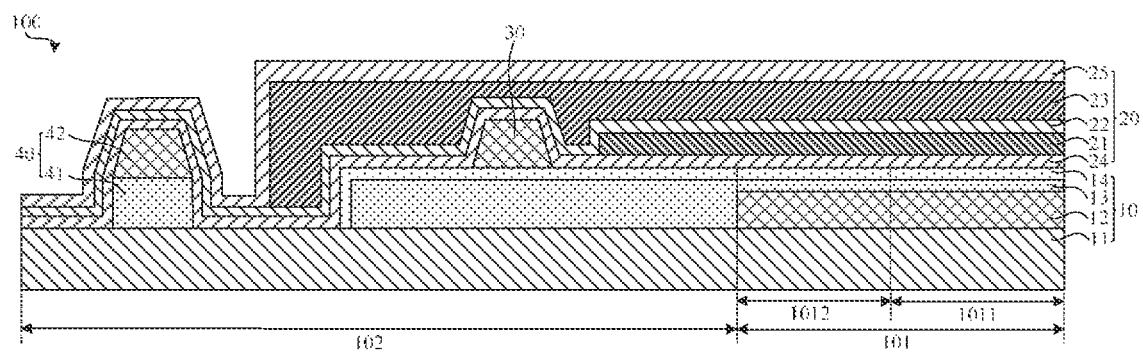
FIG. 1 is a schematic structural diagram of an OLED display panel provided by Embodiment 1 of the present application.

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application. In addition, it should be understood that the specific implementations described here are only used to illustrate and explain the present application, and are not used to limit the present application. In the present application, unless otherwise stated, the orientation words used such as "upper" and "lower" generally refer to the upper and lower directions of the device in actual use or working state, and specifically refer to the drawing directions in the drawings, while "inner" and "outer" refer to the outline of the device.

Embodiments of the present application provide an OLED display panel and electronic device, which will be described in detail below. It should be noted that the order of description in the following embodiments is not intended to limit the preferred order of the embodiments.

The present application provides an OLED display panel, which includes a display main body and an encapsulation structure. The display main body has a display area and a non-display area defined at a periphery of the display area. The encapsulation structure is arranged at one side of the display main body, wherein the encapsulation structure extends from the display area to the non-display area, the encapsulation structure includes a first organic layer, a first inorganic layer, and a second organic layer that are sequentially stacked, and the second organic layer covers a side surface of the first organic layer.

Therefore, in the OLED display panel provided by the present application, the OLED display panel provided by the present application provides the first organic layer and the second organic layer in the encapsulation structure, and the second organic layer covers the side surface of the first organic layer. When external water vapor intrudes into the encapsulation structure from an edge of the panel, if the inorganic layer at the edge of the panel has a decreased water resistance or cracks, the external water vapor will first enter the second organic layer and then the first organic layer, so that the arrangement of the two organic layers is configured to prolong an intrusion path of the water vapor and delay a time of water vapor intrusion into the display area, thereby improving an encapsulation effect at the edge of the OLED display panel.

The OLED display panel provided by the present application will be described in detail below through specific embodiments.

Referring to FIG. 1, the Embodiment 1 of the present application provides an OLED display panel 100. The OLED display panel 100 includes a display main body 10 and an encapsulation structure 20. The display main body 10 has a display area 101 and a non-display area 102 provided at a periphery of the display area 101. The encapsulation structure 20 is provided at one side of the display main body 10. The encapsulation structure 20 extends from the display area 101 to the non-display area 102. The encapsulation structure 20 includes a first organic layer 21, a first inorganic layer 22, and a second organic layer 23 arranged in sequence. The second organic layer 23 covers a side surface of the first organic layer 21.

Specifically, the display main body 10 includes a driving substrate 11, a light-emitting layer 12, a first electrode 13, and an optical cover layer 14.

The driving substrate 11 may be a thin film transistor substrate. The thin film transistor substrate includes a base and a metal oxide thin film transistor (not shown) disposed on the base, and the related technologies are all existing technologies, and will not be repeated herein for brevity.

The light-emitting layer 12 is disposed on the driving substrate 11 and located in the display area 101. The first electrode 13 covers a side of the light-emitting layer 12 away from the driving substrate 11. The first electrode 13 extends from the display area 101 to the non-display area 102. The first electrode 13 may be an anode or a cathode. In this embodiment, the first electrode 13 is a cathode. In this case, an anode (not shown) is provided on the side of the driving substrate 11 close to the light-emitting layer 12, and the related technologies are all existing technologies, and will not be repeated herein for brevity.

The optical cover layer 14 covers the side of the first electrode 13 away from the light-emitting layer 12. A material of the optical cover layer 14 may be an organic material with a high refractive index.

It should be noted that the drawings in the present application only illustrate the structure of the light-emitting layer 12, which is used to facilitate the description of various embodiments, but the OLED display panel 100 of the present application also includes a plurality of light-emitting devices arranged in an array (not shown), wherein the light-emitting device is composed of an anode, the light-emitting layer 12, and a cathode, and the related technologies are all existing technologies, and will not be repeated herein for brevity.

In this embodiment, the display area 101 includes an effective display area 1011 and an ineffective display area 1012. The ineffective display area 1012 is defined between the effective display area 1011 and the non-display area 102. The effective display area 1011 is provided with light-emitting pixels (not shown), and the ineffective display area 1012 is provided with virtual pixels (not shown). Both the first electrode 13 and the first organic layer 21 extend from the effective display area 1011 to the non-display area 102. An orthographic projection of the first organic layer 21 on a plane where the driving substrate 11 is located is within an orthographic projection of the first electrode 13 on the plane where the driving substrate 11 is located. That is, a boundary of the first organic layer 21 is arranged above the first electrode 13.

Since the ineffective display area 1012 is defined between the non-display area 102 and the effective display area 1011, in this embodiment, by arranging the boundary of the first organic layer 21 above the first electrode 13, even if external water vapor intrudes into the first organic layer 21, the external water vapor will first intrude into the ineffective display area 1012 without impacting the display of the effective display area 1011, so that the encapsulation effect of the effective display area 1011 can be ensured. In addition, since the first organic layer 21 does not occupy an additional space of the non-display area 102, the above arrangement can save the space of the non-display area 102, thereby narrowing a bezel, which is beneficial to realize a narrow bezel design of the OLED display panel 100.

Furthermore, the encapsulation structure 20 further includes a second inorganic layer 24 and a third inorganic layer 25. The second inorganic layer 24 is located on the side of the first organic layer 21 close to the display main body 10. The third inorganic layer 25 is located on the side of the second organic layer 23 away from the first inorganic layer 22. A material of each of the first inorganic layer 22, the second inorganic layer 24, and the third inorganic layer 25 may all include one or more of silicon oxide, silicon nitride, or silicon oxynitride.

In the prior art, the encapsulation of the OLED display panel is generally a three-layered encapsulation structure of an inorganic film, an organic film, and an inorganic film, and the organic film is sandwiched between two inorganic films. However, as a size of the panel increases, a possibility of foreign matter falling during a panel manufacturing process also increases. The original three-layered encapsulation structure cannot guarantee the overall encapsulation effect of the display panel, thereby reducing the manufacturing yield of the product. Therefore, in this embodiment, by providing a five-layered encapsulation structure 20 including a second inorganic layer 24, a first organic layer 21, a first inorganic layer 22, a second organic layer 23, and a third inorganic layer 25, an overall encapsulation effect of the OLED display panel 100 can be improved, thereby reducing a yield loss caused by foreign matter falling during the panel manufacturing process.

In addition, to improve the two-layered encapsulation structure containing an organic film and an inorganic film designed in the prior art, in some embodiments of the present invention, the encapsulation structure 20 may be provided only with the first inorganic layer 22 and the third inorganic layer 25 and omit the second inorganic layer 24, that is, the first organic layer 21 is in direct contact with the optical cover layer 14, and will not be repeated herein for brevity.

In this embodiment, the OLED display panel 100 further includes a dam 30. The dam 30 surrounds a periphery of the first organic layer 21. The dam 30 is located on the side of the first electrode 13 away from the driving substrate 11. Such an arrangement can prevent the first organic layer 21 from overflowing during film formation by arranging the dam 30 at the periphery of the first organic layer 21, which is beneficial to improve a film topography of the first organic layer 21.

Specifically, a number of the dams 30 may also be one. In this case, the dams 30 may have a ring structure, and the first organic layer 21 is located in an accommodation space formed by the ring structure; or, a number of the dams 30 may be multiple. A plurality of dams 30 are arranged in sequence at the periphery of the first organic layer 21. A material of the dam 30 may include organic materials such as epoxy resin or acrylic resin.

The second organic layer 23 covers a side surface of the first electrode 13. Since the first electrode 13 is usually made of a metal material, the above arrangement can reduce a probability of the first electrode 13 being intruded by external water vapor by arranging the second organic layer 23 at an outside of the first electrode 13, thereby reducing a probability of corrosion of the first electrode 13 due to oxidation, so that a failure probability of the device is reduced, thereby increasing a service life of the OLED display panel 100.

In this embodiment, the OLED display panel 100 further includes a retaining wall 40. The retaining wall 40 is provided on the driving substrate 11. The retaining wall 40 is located at a side of the second organic layer 23 away from the display area 101. The retaining wall 40 is configured to prevent the organic material used in preparation of the second organic layer 23 from overflowing. In addition, each of the first inorganic layer 22, the second inorganic layer 24, and the third inorganic layer 25 covers the retaining wall 40 to improve the water and oxygen barrier performance at the edge of the panel.

Specifically, the retaining wall 40 includes a first layer 41 and a second layer 42. The first layer 41 is located between the second layer 42 and the driving substrate 11. The first layer 41 and the planarization layer (not shown) in the driving substrate 11 can be prepared by a same process, and the second layer 42 and the pixel defining layer in the driving substrate 11 (not shown) can be prepared by a same process, and the related technologies are existing technologies, and will not be repeated herein for brevity. It should be noted that, in some embodiments, the retaining wall 40 may also include only one of the first layer 41 and the second layer 42. The present application does not specifically limit the structure of the retaining wall 40.

Therefore, in this embodiment, if one or more of the first inorganic layer 22, the second inorganic layer 24, and the third inorganic layer 25 has a decreased water resistance or cracks, since a side of the effective display area 1011 close the display area 102 is provided with the first organic layer 21 and the second organic layer 23 covering a side surface of the first organic layer 21, when external water vapor intrudes from the non-display area 102, the external water vapor will first enter the second organic layer 23 and then enter the first organic layer 21. Compared with a single-layered organic layer encapsulation method, this embodiment prolongs an intrusion path of water vapor at the edge of the panel, delays an intrusion time of water vapor, thereby improving the encapsulation effect at the edge of the OLED display panel 100, which is beneficial to increase a service life of the OLED display panel 100, thus improving a manufacturing yield of products.

Figure 2:
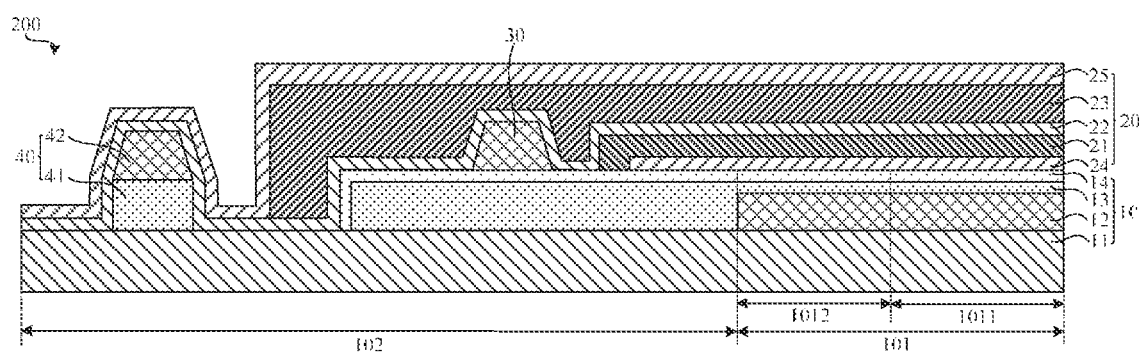
FIG. 2 is a schematic structural diagram of an OLED display panel provided by Embodiment 2 of the present application.

Referring to FIG. 2, Embodiment 2 of the present application provides an OLED display panel 200. The difference between the OLED display panel 200 provided in Embodiment 2 of the present application and Embodiment 1 is that the second inorganic layer 24 is located on the side of the dam 30 close to the display area 101. The first organic layer 21 covers the side surface of the second inorganic layer 24.

The inventors of the present application have discovered through experimental investigations that when metal oxide thin film transistors such as IGZO thin film transistors are used in large-sized display panels, due to consideration of electrical performance of the panel, silicon oxide or silicon nitride with a lower hydrogen content is usually used as a material to prepare the inorganic layer, and the closer the inorganic layer is to the thin film transistor, the lower the hydrogen content, so as to reduce a probability of hydrogen diffusion into the thin film transistor device, thereby reducing an impact of hydrogen on electrical performance of the thin film transistor. However, when the amount of hydrogen in the inorganic layer is small, the water vapor barrier effect of the inorganic layer is reduced, and the risk of failure of the inorganic layer at the edge of the panel under the intrusion of water vapor is increased.

Therefore, in this embodiment, the first organic layer 21 covers the side surface of the second inorganic layer 24, that is, by retracting the second inorganic layer 24, the water vapor is possibly prevented from intruding along the side surface of the second inorganic layer 24, and the risk of failure of the second inorganic layer 24 due to the intrusion of water vapor is reduced, so that the encapsulation effect at the edge of the panel can be further improved. In addition, because the above arrangement reduces the occupied space of the second inorganic layer 24 in the non-display area 102, a total thickness of the inorganic film in the non-display area 102 is reduced, which is beneficial to reduce a stress in the non-display area 102, thereby reducing a risk of peeling between layers at the edge of the panel, thus improving a bending performance of the OLED display panel 200 in the non-display area 102.

Further, after retraction of the second inorganic layer 24, a part of the first organic layer 21 located beyond the second inorganic layer 24 is in direct contact with the optical cover layer 14. Since the optical cover layer 14 is an organic layer, the first organic layer 21 and the optical cover layer 14 have a good bonding strength. Therefore, this embodiment can improve the bonding strength between the first organic layer 21 and the display main body 10, that is, the bonding strength between the encapsulation structure 20 and the display main body 10 is increased, which is beneficial to improve reliability of the panel.

Figure 3:
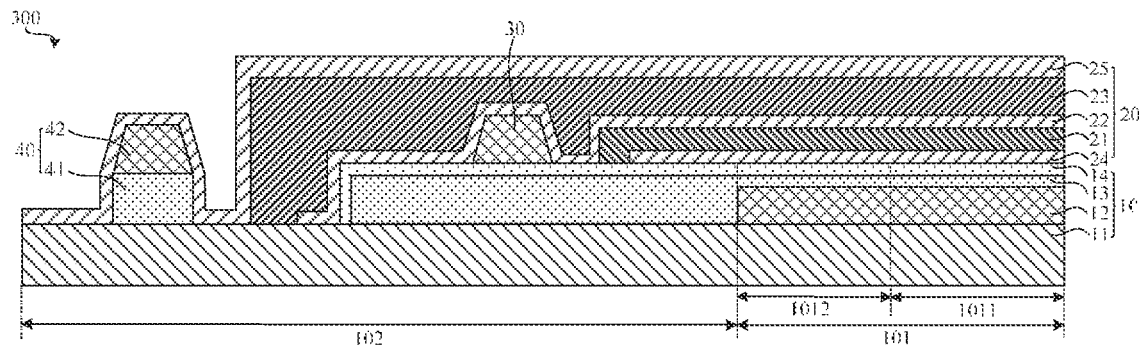
FIG. 3 is a schematic structural diagram of an OLED display panel provided by Embodiment 3 of the present application.

Referring to FIG. 3, Embodiment 3 of the present application provides an OLED display panel 300. A difference between the OLED display panel 300 provided by Embodiment 3 of the present application and Embodiment 2 is that the first inorganic layer 22 is located at a side of the retaining wall 40 close to the display area 101. The boundary of the first inorganic layer 22 is located between the first electrode 13 and the retaining wall 40. The second organic layer 23 covers the side surface of the first inorganic layer 22.

In this embodiment, the second organic layer 23 covers the side surface of the first inorganic layer 22, that is, by retracting of the first inorganic layer 22, the water vapor is possibly prevented from intruding along the side surface of the first inorganic layer 22, and the risk of failure of the first inorganic layer 22 due to the intrusion of water vapor is reduced, so that the encapsulation effect at the edge of the panel can be further improved. In addition, because the above arrangement reduces the occupied space of the first inorganic layer 22 in the non-display area 102, a total thickness of the inorganic film in the non-display area 102 is reduced, which is beneficial to reduce a stress in the non-display area 102, thereby reducing a risk of peeling between layers at the edge of the panel, thus improving a bending performance of the OLED display panel 200 in the non-display area 102.

Figure 4:
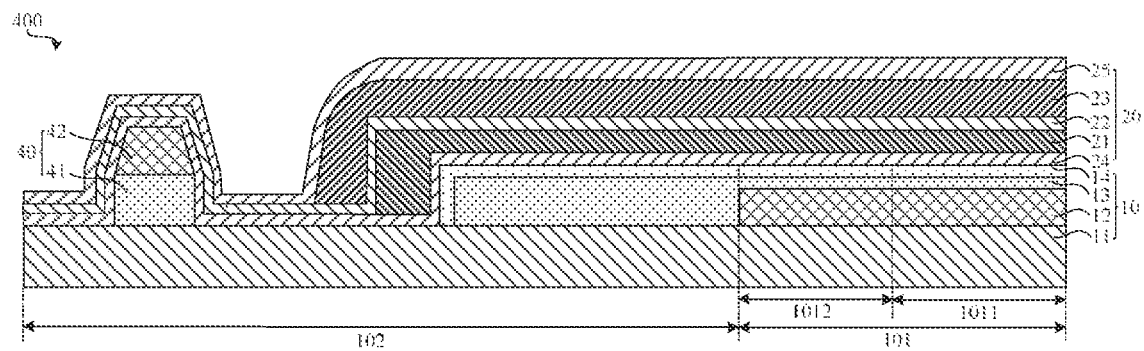
FIG. 4 is a schematic structural diagram of an OLED display panel provided by Embodiment 4 of the present application.

Referring to FIG. 4, Embodiment 4 of the present application provides an OLED display panel 400. A difference between the OLED display panel 400 provided by Embodiment 4 of the present application and Embodiment 1 is that the first organic layer 21 covers the side surface of the first electrode 13. A dam 30 is not provided in the OLED display panel 400.

In this embodiment, the first organic layer 21 covers the side surface of the first electrode 13, so that the first organic layer 21 and the second organic layer 23 are located at the outside of the first electrode 13 at the same time, thereby prolonging the intrusion path of the water vapor outside the first electrode 13, and delaying the time for water vapor to enter the first electrode 13, so that the probability of the first electrode 13 being intruded by external water vapor is further reduced, thus further reducing a failure probability of the device. In addition, since the arrangement of the dam 30 is omitted in this embodiment, the overflow of organic materials during film formation of the first organic layer 21 and the second organic layer 23 can be prevented at the same time through the barrier effect of the retaining wall 40, thereby saving the manufacturing cost of the OLED display panel 400.

Figure 5:
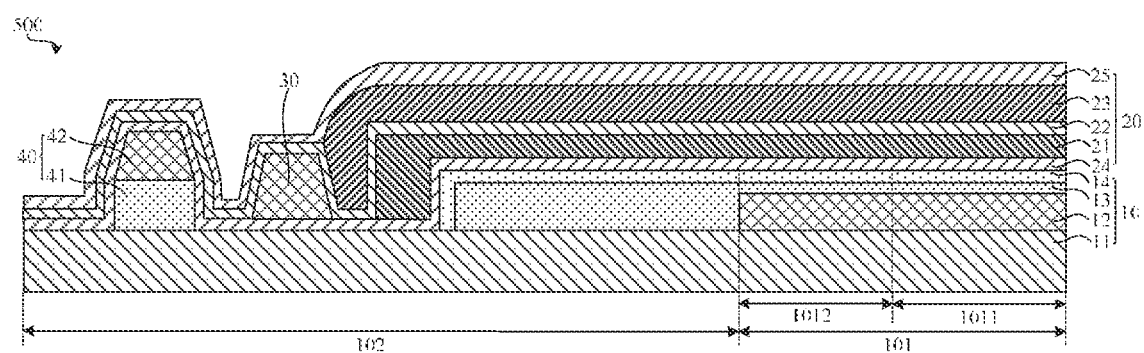
FIG. 5 is a schematic structural diagram of an OLED display panel provided by Embodiment 5 of the present application.

Referring to FIG. 5, Embodiment 5 of the present application provides an OLED display panel 500. The difference between the OLED display panel 500 provided by Embodiment 5 of the present application and Embodiment 1 is that the first organic layer 21 covers the side surface of the first electrode 13. The dam 30 is located between the retaining wall 40 and the second organic layer 23. The height of the dam 30 is smaller than the height of the retaining wall 40.

In this embodiment, the first organic layer 21 covers the side surface of the first electrode 13, so that the first organic layer 21 and the second organic layer 23 are located at the outside of the first electrode 13 at the same time, thereby prolonging the intrusion path of the water vapor outside the first electrode 13, and delaying the time for water vapor to enter the first electrode 13, so that the probability of the first electrode 13 being intruded by external water vapor is further reduced, thus further reducing a failure probability of the device. In addition, the double barrier effect of the dam 30 and the retaining wall 40 can greatly increase a probability of overflow of the organic material, which is beneficial to improve the film topography of the first organic layer 21 and the second organic layer 23.

Figure 6:
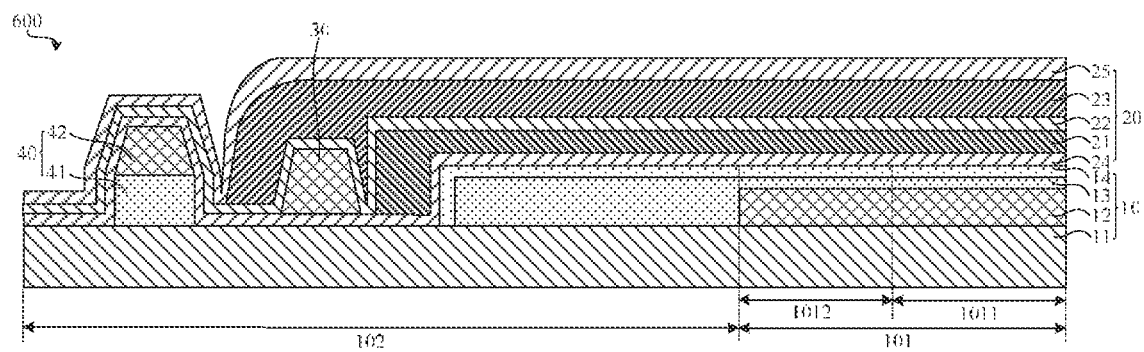
FIG. 6 is a schematic structural diagram of an OLED display panel provided by Embodiment 6 of the present application.

Referring to FIG. 6, Embodiment 6 of the present application provides an OLED display panel 600. A difference between the OLED display panel 600 provided by Embodiment 6 of the present application and Embodiment 5 is that the second organic layer 23 covers the dam 30 and extends to an area between the dam 30 and the retaining wall 40.

In this embodiment, the second organic layer 23 is extended to the area between the dam 30 and the retaining wall 40, that is, the boundary of the second organic layer 23 is arranged between the dam 30 and the retaining wall 40, thereby increasing an occupied area of the second organic layer 23 in the non-display area 102, and increasing the distance from the boundary of the second organic layer 23 to the display area 101, thereby prolonging the intrusion path of external water vapor in the organic layer, thus further improving the encapsulation effect of the OLED display at the edge of the panel 600.

Figure 7:
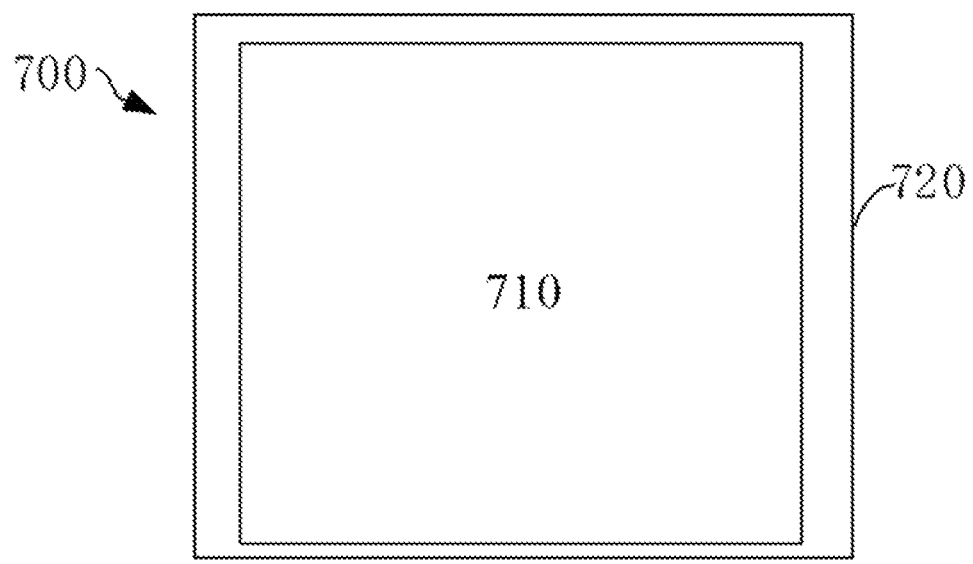
FIG. 7 is a schematic structural diagram of an electronic device according to an embodiment of the present application.

The present application also provides an electronic device 700, which can be any product or component with display function such as electronic paper, mobile phone, tablet computer, television, monitor, notebook computer, digital photo frame, navigator, etc. The electronic device 700 includes a housing 720 and an OLED display panel 710 arranged in the housing 720. The OLED display panel 710 may be the OLED display panel described in any of the foregoing embodiments, as shown in FIG. 7. Specific structure of the OLED display panel 710 can be referred to the description of the foregoing embodiments, and will not be repeated herein for brevity.

The OLED display panel and the electronic device provided by the embodiments of the present application are described in detail above. Specific examples are used to explain the principle and implementation of the present application. The descriptions of the above embodiments are only used to help understand the present application. Also, for those skilled in the art, according to the ideas of the present application, there will be changes in the specific implementation and application scope. In summary, the content of this specification should not be construed as limiting the present application.

What is claimed is:

1. An organic light-emitting diode (OLED) display panel, comprising:
   a display main body, wherein the display main body has a display area and a non-display area defined at a periphery of the display area, the display area comprises an effective display area and an ineffective display area, and the ineffective display area is defined between the effective display area and the non-display area; and
   an encapsulation structure disposed at one side of the display main body, wherein the encapsulation structure extends from the display area to the non-display area, the encapsulation structure comprises a first organic layer, a first inorganic layer, and a second organic layer that are sequentially stacked, and the second organic layer covers a side surface of the first organic layer;
   wherein the encapsulation structure further comprises a second inorganic layer and a third inorganic layer, the second inorganic layer is disposed at a side of the first organic layer close to the display main body, and the third inorganic layer is located on a side of the second organic layer away from the first inorganic layer;
   wherein the OLED display panel further comprises a dam, the dam is located on a side of the first organic layer away from the display area, an orthographic projection of the second inorganic layer on a plane where the display main body is located is within an orthographic projection of the first organic layer on the plane where the display main body is located, the first organic layer covers a side surface of the second inorganic layer away from an end portion of the display area, and the first organic layer and the second inorganic layer are located within an area of the non-display area close to the ineffective display area; and
   wherein each of the first inorganic layer, the second organic layer, and the third inorganic layer covers the dam and extends to a side of the dam away from the display area.

2. The OLED display panel according to claim 1, wherein the display main body comprises a driving substrate, a light-emitting layer, and a first electrode, the light-emitting layer is disposed on the driving substrate and located in the display area, and the first electrode covers a side of the light-emitting layer away from the driving substrate and extends from the display area to the non-display area; and
   wherein an orthographic projection of the first organic layer on a plane where the driving substrate is located is within an orthographic projection of the first electrode on the plane where the driving substrate is located.

3. The OLED display panel according to claim 2, wherein the dam surrounds a peripheral of the first organic layer and is located on a side of the first electrode away from the driving substrate.

4. The OLED display panel according to claim 3, wherein the second organic layer covers a side surface of the first electrode; and
   the OLED display panel further comprises a retaining wall, the retaining wall is disposed on the driving substrate and located at a side of the second organic layer away from the display area, and each of the first inorganic layer, the second inorganic layer, and the third inorganic layer covers the retaining wall.

5. The OLED display panel according to claim 4, wherein the dam is disposed between the retaining wall and the first organic layer.

6. The OLED display panel according to claim 3, wherein the second organic layer covers a side surface of the first electrode; and
   the OLED display panel further comprises a retaining wall disposed on the driving substrate and located at a side of the second organic layer away from the display area, and each of the first inorganic layer and the third inorganic layer covers the retaining wall.

7. The OLED display panel according to claim 3, wherein the second organic layer covers a side surface of the first electrode; and
   the OLED display panel further comprises a retaining wall disposed on the driving substrate and located at a side of the second organic layer away from the display area, the first inorganic layer is located at a side of the retaining wall close to the display area, the second organic layer covers a side surface of the first inorganic layer, and the third inorganic layer covers the retaining wall.

8. The OLED display panel according to claim 1, wherein the first organic layer extends from the effective display area to the non-display area.

9. An electronic device, wherein the electronic device comprises a housing and an organic light-emitting diode (OLED) display panel disposed in the housing, and the OLED display panel comprises:
   a display main body, wherein the display main body has a display area and a non-display area defined at a periphery of the display area, the display area comprises an effective display area and an ineffective display area, and the ineffective display area is defined between the effective display area and the non-display area; and
   an encapsulation structure disposed at one side of the display main body, wherein the encapsulation structure extends from the display area to the non-display area, the encapsulation structure comprises a first organic layer, a first inorganic layer, and a second organic layer that are sequentially stacked, and the second organic layer covers a side surface of the first organic layer;
   wherein the encapsulation structure further comprises a second inorganic layer and a third inorganic layer, the second inorganic layer is disposed at a side of the first organic layer close to the display main body, and the third inorganic layer is located on a side of the second organic layer away from the first inorganic layer;

wherein the OLED display panel further comprises a dam, the dam is located on a side of the first organic layer away from the display area, an orthographic projection of the second inorganic layer on a plane where the display main body is located is within an orthographic projection of the first organic layer on the plane where the display main body is located, the first organic layer covers a side surface of the second inorganic layer away from an end portion of the display area, and the first organic layer and the second inorganic layer are located within an area of the non-display area close to the ineffective display area; and wherein each of the first inorganic layer, the second organic layer, and the third inorganic layer covers the dam and extends to a side of the dam away from the display area.

10. The electronic device according to claim 9, wherein the display main body comprises a driving substrate, a light-emitting layer, and a first electrode, the light-emitting layer is disposed on the driving substrate and located in the display area, and the first electrode covers a side of the light-emitting layer away from the driving substrate and extends from the display area to the non-display area; and wherein an orthographic projection of the first organic layer on a plane where the driving substrate is located is within an orthographic projection of the first electrode on the plane where the driving substrate is located.

11. The electronic device according to claim 10, wherein the dam surrounds a peripheral of the first organic layer and is located on a side of the first electrode away from the driving substrate.

12. The electronic device according to claim 11, wherein the second organic layer covers a side surface of the first electrode; and the OLED display panel further comprises a retaining wall, the retaining wall is disposed on the driving substrate and located at a side of the second organic layer away from the display area, and each of the first inorganic layer, the second inorganic layer, and the third inorganic layer covers the retaining wall.

13. The electronic device according to claim 12, wherein the dam is disposed between the retaining wall and the first organic layer.

14. The electronic device according to claim 11, wherein the second organic layer covers a side surface of the first electrode; and the OLED display panel further comprises a retaining wall disposed on the driving substrate and located at a side of the second organic layer away from the display area, and each of the first inorganic layer and the third inorganic layer covers the retaining wall.

15. The electronic device according to claim 11, wherein the second organic layer covers a side surface of the first electrode; and the OLED display panel further comprises a retaining wall disposed on the driving substrate and located at a side of the second organic layer away from the display area, the first inorganic layer is located at a side of the retaining wall close to the display area, the second organic layer covers a side surface of the first inorganic layer, and the third inorganic layer covers the retaining wall.

* * * * *